United States Patent
Delabie et al.

(10) Patent No.: US 8,007,865 B2
(45) Date of Patent: Aug. 30, 2011

(54) ATOMIC LAYER DEPOSITION (ALD) METHOD AND REACTOR FOR PRODUCING A HIGH QUALITY LAYER

(75) Inventors: Annelies Delabie, Bierbeek (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 714 days.

(21) Appl. No.: 11/444,132

(22) Filed: May 31, 2006

(65) Prior Publication Data

US 2006/0286810 A1    Dec. 21, 2006

Related U.S. Application Data

(60) Provisional application No. 60/686,811, filed on Jun. 1, 2005.

(30) Foreign Application Priority Data

Nov. 25, 2005  (EP) .................................... 05447261

(51) Int. Cl.
   *C23C 16/00*  (2006.01)
(52) U.S. Cl. .................................. 427/248.1
(58) Field of Classification Search ........................ None
   See application file for complete search history.

(56) References Cited

U.S. PATENT DOCUMENTS

| | | | |
|---|---|---|---|
| 5,420,072 A * | 5/1995 | Fiordalice et al. | 438/607 |
| 6,878,402 B2 * | 4/2005 | Chiang et al. | 427/248.1 |
| 2001/0019737 A1 * | 9/2001 | Chan et al. | 427/255.27 |
| 2001/0054769 A1 * | 12/2001 | Raaijmakers et al. | 257/758 |
| 2002/0068458 A1 * | 6/2002 | Chiang et al. | 438/694 |
| 2003/0017697 A1 * | 1/2003 | Choi et al. | 438/679 |
| 2003/0024806 A1 * | 2/2003 | Foret | 204/164 |
| 2003/0073308 A1 * | 4/2003 | Mercaldi | 438/680 |
| 2003/0168750 A1 * | 9/2003 | Basceri et al. | 257/915 |
| 2005/0153571 A1 * | 7/2005 | Senzaki | 438/778 |
| 2009/0242520 A1 * | 10/2009 | Hirayama | 219/121.41 |

* cited by examiner

*Primary Examiner* — Timothy H Meeks
*Assistant Examiner* — Joseph Miller, Jr.
(74) *Attorney, Agent, or Firm* — Knobbe Martens Olson & Bear LLP

(57) ABSTRACT

One inventive aspect is related to an atomic layer deposition (ALD) method comprising:
  a) providing a semiconductor substrate in a reactor,
  b) providing a pulse of a first precursor gas into the reactor at a first temperature,
  c) providing a first pulse of a second precursor gas into the reactor at a second temperature, and
  d) providing a second pulse of the second precursor gas at a third temperature lower than the second temperature. Another inventive aspect relates to a reactor suitable to apply the method.

20 Claims, 6 Drawing Sheets

ATOMIC LAYER DEPOSITION (ALD) METHOD AND REACTOR FOR PRODUCING A HIGH QUALITY LAYER

CROSS-REFERENCE TO RELATED APPLICATIONS

This application claims priority under 35 U.S.C. Section 119(e) to U.S. provisional patent application 60/686,811 filed on Jun. 1, 2005, which application is hereby incorporated by reference in its entirety.

BACKGROUND OF THE INVENTION

1. Field of the Invention

The present invention is related to an improved method for atomic layer deposition. Further, it is also related to a reactor design suitable for applying the method.

2. Description of the Related Technology

Because in the field of electronics in general further downscaling of the semiconductor devices is always proceeding, deposition processes have to be developed able to deposit layers with a thickness control at atomic layer scale.

One of these deposition techniques is atomic layer deposition (ALD), often used for depositing dielectric layers.

Atomic layer deposition is a thin film deposition technique based on the used for separated chemisorption reactions of at least two gas phase reactants with a substrate.

There are two characteristics which can limit the quality and scalability of layers deposited by ALD. A first characteristic is the growth-per-cycle (GPC), which often is much lower than the theoretical maximum of one monolayer per cycle. This can result in film roughness and slow film closure, which makes especially thin films (thinner than about 5 nm) prone to localized defects such as pinholes.

A second characteristic is the presence of impurities due to unreacted precursor ligands.

For example, in the deposition of hafnium oxide from hafnium tetrachloride and water, the growth-per-cycle is only 20% of a monolayer and the Cl-impurities remain in the deposited layer.

SUMMARY OF CERTAIN INVENTIVE ASPECTS

Certain inventive aspects aim to provide an ALD method and reactor to fabricate a high-quality ALD layer under optimized process conditions.

One inventive aspect provides an ALD method comprising:
a) providing a semiconductor substrate in a reactor
b) providing a pulse of a first precursor gas into the reactor at a first reactor temperature,
c) providing a first pulse of a second precursor gas into the reactor at a second temperature,
d) providing a second pulse of the second precursor gas at a third temperature lower than the second temperature, and
e) optionally, repeating at least once step b) through step d) till a desired layer thickness is achieved.

The first precursor gas can be a halide or an oxyhalide such as $POCl_3$, and more particularly it can be a metal halide or a metal oxyhalide such as $HfCl_4$, $TaCl_5$, $WF_6$, $WOCl_4$, $ZrCl_4$, $AlCl_3$, $TiCl_4$, $SiCl_4$ or the like.

The second precursor gas can be any precursor able to decompose the first precursor, or to eliminate the ligands of the first precursor. More particularly it can be $H_2O$, $H_2O2$, $O_2$, $O_3$, $NH_3$, $H_2S$, $H_2Se$, $PH_3$, $AsH_3$, $C_2H_4$ or $Si_2H_6$.

In a method according to one inventive aspect the first temperature can be between about 100° C. and about 800° C., preferably between about 150° C. and about 650° C., or between about 200° C. and about 500° C., or more preferably between about 225° C. and about 375° C.

In a method according to one inventive aspect the second temperature can be substantially equal or higher than the first temperature, more particularly between about 100° C. and about 800° C., preferably between about 150° C. and about 650° C., or between about 200° C. and about 500° C., or more preferably between about 225° C. and about 375° C.

In a method according to one inventive aspect the third temperature can be substantially lower than the second temperature, preferably lower than about 500° C., or than about 350° C., or than about 225° C. and more preferably is room temperature.

A method according to one inventive aspect can further comprise the step of heating the substrate surface at a fourth temperature, between step c) and d).

In a method according to one inventive aspect the fourth temperature can be substantially equal or higher than the second temperature, preferably higher than about 375° C. and more preferably equal to about 500° C.

In a method according to one inventive aspect, the step of heating the substrate surface at a fourth temperature can be performed in inert atmosphere.

In a method according to one inventive aspect, the substrate can be exposed to a plasma treatment during and/or after step d).

The plasma used for the plasma treatment can consist of $N_2O$, $NO$, $O_2$, $N_2$, $H_2$, $NO_2$, or $NH_3$, etc.

In a method according to one inventive aspect the first and second temperature is about 300° C., the third temperature is room temperature and the fourth temperature (if any) is about 500° C.

One inventive aspect also provides an ALD reactor suitable for carrying out a method according to one inventive aspect.

Such an ALD reactor comprises:
i. a first and a second susceptor,
ii. means for heating a substrate when present on the first susceptor, and
iii. means for cooling the substrate when present on the second susceptor.

The reactor according to one inventive aspect can further comprise means for transporting a semiconductor substrate between both susceptors.

The reactor according to one inventive aspect can further comprise means for producing a plasma.

DETAILED DESCRIPTION OF CERTAIN EMBODIMENTS

Figure 1:
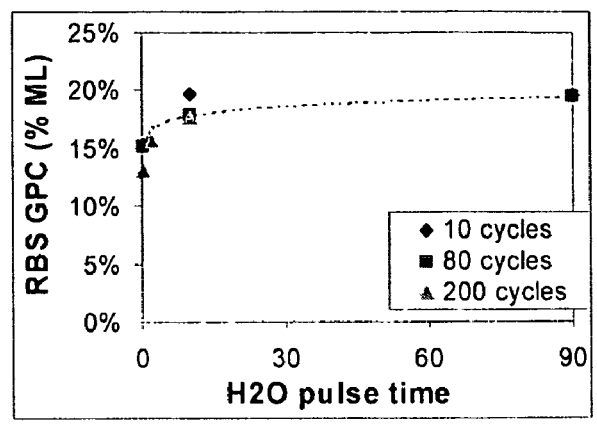
FIG. 1 illustrates the effect of the $H_2O$ pulse length on the GPC as determined by RBS (Rutherford Backscattering Spectroscopy).

Atomic layer deposition (ALD) is a thin film deposition technique based on the use of separated chemisorption reactions of at least two gas phase reactants with a substrate. Such gas phase reactants are also called precursor gasses.

There are two characteristics which can limit the quality and scalability of layers deposited by ALD.

A first characteristic is the growth-per-cycle (or growth rate), which is often much lower than the theoretical maximum of one monolayer per cycle. This can result in film roughness and slow film closure, which makes especially thin films (on the order of less than 5 nm) prone to localized defects such as pinholes.

A second characteristic is the presence of impurities due to unreacted precursor ligands.

In order to optimize the above characteristics, the present invention provides an ALD method comprising the steps of:
a) providing a semiconductor substrate in a reactor,
b) providing a pulse of a first precursor gas into the reactor at a first temperature,
c) providing a first pulse of a second precursor gas into the reactor at a second temperature,
d) providing a second pulse of the second precursor gas at a third temperature lower than the second temperature, and
e) optionally repeating at least once step b) through step d) till a desired layer thickness is achieved.

The semiconductor substrate can comprise or can consist of any semiconductor material(s) suitable in the field of IC processing. In particular it can comprise or can consist of silicon, germanium or silicon germanium.

The layer obtainable by a method according to one embodiment can be of a substantially pure element (e.g. Si, Cu, Ta, W), an oxide (e.g. $SiO_2$, $GeO_2$, $HfO_2$, $ZrO_2$, $Ta_2O_5$, $TiO_2$, $Al_2O_3$, $PO_x$, $VO_x$, $CrO_x$, $FeO_x$, ZnO, $SnO_2$, $Sb_2O_5$, $B_2O_3$, $In_2O_3$, $WO_3$), a nitride (e.g. $Si_3N_4$, TiN, $TaN_x$, AlN, BN, GaN, NbN, $Mo_xN$, $W_xN$), a carbide (e.g. SiC), a sulfide (e.g. CdS, ZnS, MnS, $WS_2$, PbS), a selenide (e.g. CdSe, ZnSe), a phosphide (e.g. GaP, InP), an arsenide (e.g. GaAs, InAs), or mixtures thereof.

The first precursor gas can be a halide or an oxyhalide such as $POCl_3$. More particularly it can be a metal halide or a metal oxyhalide. For example, the first precursor can be $HfCl_4$, $TaCl_5$, $WF_6$, $WOCl_4$, $ZrCl_4$, $AlCl_3$, $TiCl_4$, $SiCl_4$ or the like.

The second precursor gas can be any precursor able to eliminate the ligands of the first precursor. More particularly it can be $H_2O$, $H_2O_2$, $O_2$, $O_3$, $NH_3$, $H_2S$, $H_2Se$, $PH_3$, $AsH_3$, $C_2H_4$ or $Si_2H_6$.

In the context of one embodiment the first, second and third temperature is to be understood as the temperature in the reactor, unless otherwise stated.

In a method according to one embodiment the first temperature can be between (about) 100° C. and (about) 800° C., preferably between (about) 150° C. and (about) 650° C., or between (about) 200° C. and (about) 500° C., and more preferably between (about) 225° C. and (about) 375° C.

In a method according to one embodiment the second temperature can be substantially equal or higher than the first temperature, between (about) 100° C. and (about) 800° C., preferably between (about) 150° C. and (about) 650° C., or between (about) 200° C. and (about) 500° C., and more preferably between (about) 225° C. and (about) 375° C.

In a method according to one embodiment the third temperature can be substantially lower than the second temperature, preferably lower than (about) 500° C., or lower than (about) 350° C., or lower than (about) 225° C. and more preferably is room temperature.

A method according to one embodiment can further comprise the step of heating the substrate surface at a fourth temperature, between step c) and d).

In a method according to one embodiment this fourth temperature can be substantially equal or higher than the second temperature, higher than (about) 375° C. and preferably equal to (about) 500° C.

The step of heating the substrate surface at a fourth temperature can be performed in inert atmosphere, such as but not limited to nitrogen or argon.

In a method according to one embodiment, the substrate can be exposed to a plasma treatment during and/or after step d). The plasma can be direct or remote.

The plasma can consist of $N_2O$, NO, $O_2$, $N_2$, $H_2$, $NO_2$, or $NH_3$, etc.

In a method according to one embodiment the first and second temperature is (about) 300° C., the third temperature is room temperature and the fourth temperature is (about) 500° C.

One embodiment provides also a new reactor design that is suitable for performing the method of one embodiment and in which reactions can be performed at their optimized temperature.

Such an ALD reactor comprises:
a first and a second susceptor,
means for heating a substrate when present on the first susceptor, and
means for cooling the substrate when present on the second susceptor.

In the framework of one embodiment, a susceptor is any means, e.g. a plate, suitable for supporting (bearing) the substrate upon which the layer is to be deposited.

The ALD reactor according to one embodiment can further comprise means for transporting a semiconductor substrate between both susceptors.

The ALD reactor according to one embodiment can further comprise means for producing a plasma.

According to one embodiment, the means for heating can comprise flash lamps or any means to create a temperature increase of at least the substrate surface.

According to one embodiment, the means for cooling can comprise a recirculating cooling medium, such as cooled nitrogen, or a Peltier element or any means to create a temperature decrease of at least the substrate surface.

In a particular embodiment according to the present invention, a hafnium oxide layer can be deposited using a method of one embodiment wherein hafnium tetrachloride is the first precursor gas and water the second precursor gas.

More particularly, an ALD method for depositing an hafnium oxide layer can comprise:
i. providing a semiconductor substrate in the ALD reactor,
ii. providing a pulse of $HfCl_4$ in the reactor at 300° C.,
iii. providing a first pulse of $H_2O$ in the reactor at 300° C.,
iv. optionally heating the substrate at 500° C. in $N_2$ atmosphere,
v. providing a second pulse of $H_2O$ in the reactor at room temperature, while the substrate can be exposed to an $N_2O$ plasma treatment, and vi. optionally, repeating at least once step ii) through step v).

The reaction cycle (step (ii) through step (v)) can then be repeated until the desired layer thickness is obtained.

The step of providing the second pulse of $H_2O$ can also comprise exposure to moisture present in the reactor.

The steps of providing a pulse of $HfCl_4$, providing a first pulse of $H_2O$ and heating the substrate can be performed on the first susceptor. The temperature is maintained constant at (about) 300° C. Heating instruments, e.g. (flash) lamps, are provided for fast wafer surface temperature increase from (about) 300° C. to (about) 500° C. when the substrate is present on the first susceptor.

Then the substrate is transported from the first to the second susceptor.

The second $H_2O$ pulse (which can comprise moisture exposure during transportation in this case) and optionally plasma exposure can be performed on the second susceptor at lower temperature. Cooling instruments are provided for wafer surface temperature decrease below (about) 225° C. or even to room temperature.

By means of conventional ALD, the deposition of hafnium oxide from hafnium tetrachloride and water, the growth-per-cycle is only 20% of a monolayer and the Cl-impurities remain in the deposited layer.

By means of the method according to one embodiment, the growth-per-cycle can be enhanced from 15% to 40% of a monolayer and the Cl-content can be reduced by 2 orders of magnitude.

Though the following example describes only the deposition of $HfO_2$ from $HfCl_4$ and $H_2O$, it is to be understood that the first and second precursors as defined in the present invention are expected to follow the same chemical mechanisms as described in the example section, when carrying out a method of one embodiment. Therefore, the present invention is not intended to be limited to the following illustrative example.

EXAMPLE

Atomic Layer Deposition (ALD) is based on the use of separated chemisorption reactions of at least two gas phase reactants with a substrate.

For the deposition of $HfO_2$ from $HfCl_4$ and $H_2O$, $HfCl_4$, which is the first precursor, chemisorbs on the substrate by reaction with surface —OH groups:

$$xOH* + HfCl_4 \rightarrow O_xHfCl_{4-x}* + xHCl \tag{1}$$

The chemisorption must be self-limiting and saturated within the time of the precursor pulse. When full saturation is reached, the excess of $HfCl_4$ and the gas reaction byproducts are purged away by an nitrogen flow, further referred to as a nitrogen purge. Thereafter, pulse and nitrogen purge steps are repeated with the $H_2O$ precursor in order to hydrolyze the Hf—Cl bonds.

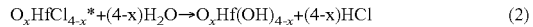

$$O_xHfCl_{4-x}* + (4-x)H_2O \rightarrow O_xHf(OH)_{4-x} + (4-x)HCl \tag{2}$$

This sequence is repeated until the desired $HfO_2$ film thickness is obtained.

Usually, the growth-per-cycle is less than 1 monolayer because of the following limitations: either the number of reactive sites on the substrate is limited, or steric effects from bulky precursors limit the amount of material to be chemisorbed.

Moreover, the growth-per-cycle can depend on the starting substrate—when the substrate changes from the starting substrate (for example silicon substrate) to the deposited material itself. When starting substrate effects have vanished, the growth-per-cycle becomes constant and is referred to as the steady growth-per-cycle.

Furthermore, the growth-per-cycle can depend on the temperature of the deposition.

For the conventional $HfCl_4/H_2O$ process (also referred to as Standard $HfCl_4/H_2O$ ALD process), the steady growth-per-cycle at 300° C. is only 15%-17% of a monolayer (also referred to as % ML). Several experimental observations indicate that the low $HfO_2$ growth-per-cycle is caused by limitation of the number of reactive sites, the —OH groups in the $HfCl_4$ reaction.

For example, the decreasing growth-per-cycle as a function of temperature is attributed to decreased hydroxylation of the $HfO_2$ surface. This implies that the $HfCl_4$ reaction with oxygen bridging sites is not very efficient. Indeed, it has been shown that the $ZrCl_4$ species (the $HfCl_4$ and $ZrCl_4$ chemistries are very similar) are not very reactive towards siloxane bridges, since the pre-heating temperature of the support influences the amount of adsorbed Zr.

Furthermore, substrate inhibition occurs typically on surfaces with too low —OH density, for example HF cleaned Si.

As an illustration of several embodiments of the present invention, an ALD reaction cycle with different intermediate treatments, such as exposure to gas phase moisture, plasma treatments or thermal anneals is studied and compared to the Standard ALD cycle.

In the case of an ALD cycle with plasma treatments, which is a particular embodiment of the present invention, this extended ALD process is also referred to as Intermediate Remote Plasma Assisted (IRPA) ALD.

In the case of an ALD cycle with a thermal anneal, which is also a particular embodiment of the present invention, this extended ALD process is also referred to as Intermediate Thermal Anneal (ITA) ALD.

A first goal is to increase the number of —OH groups at the $HfO_2$ surface, in order to enhance the growth-per-cycle. A theoretical model predicts that the higher the growth-per-cycle, the lower the number of cycles required for film closure and the lower the roughness of the film. Therefore, the improvement of the quality and scalability of $HfO_2$ layers by enhancing the growth-per-cycle with intermediate treatments is investigated.

A second goal is to reduce the Cl-content of the HfO2 layers. Indeed, the intermediate treatments can affect the growth-per-cycle and the Cl-content.

All samples are processed in a Polygon 8200 cluster. Prior to deposition, a chemical oxide of 1 nm thickness is grown. $HfO_2$ is deposited in an ALDTM Pulsar 2000 reactor, a hot wall cross-flow type reactor with inert gas valving. The pressure in the reactor is 1.33 mbar (1 Torr). All pulses with $HfCl_4$ precursor and first pulses with $H_2O$ precursor are performed at 300° C. $HfCl_4$ is a solid at room temperature. It is heated to approximately 185° C. to achieve sufficient vapor pressure for the $HfCl_4$ pulses. The pulse and inert gas purge times for the Standard process are indicated in Table 1. Elongation of the purge times after $HfCl_4$ or $H_2O$ pulses up to 5 minutes does not change the growth-per-cycle, suggesting that the precursor pulses are well separated in the standard conditions. Moreover, this indicates that there is sufficient recovery time of the $HfCl_4$ solid source between different pulses.

TABLE 1

Pulse and inert gas purge parameters in the standard HfO₂ deposition.

| | |
|---|---|
| HfCl₄ pulse (s) | 0.1 |
| N₂ purge (s) | 1 |
| H₂O pulse (s) | 0.3 |
| N₂ purge (s) | 3 |

Samples are measured by spectroscopic ellipsometry (SE) on a KLA-Tencor ASET F5. RBS is performed in a RBS400 end station (Charles Evans and Associates) with a 1 MeV He+ beam. TOFSIMS depth profiles are measured with an IonTOF-IV instrument using a dual beam set-up with a 500 eV Ar+ ion beam.

Intermediate treatments are performed in an Epsilon Nitride CVD (Chemical Vapor Deposition) reactor, equipped with a remote Microwave Radical Generator (MRG) or in the transport module of the polygon cluster.

Figure 2:
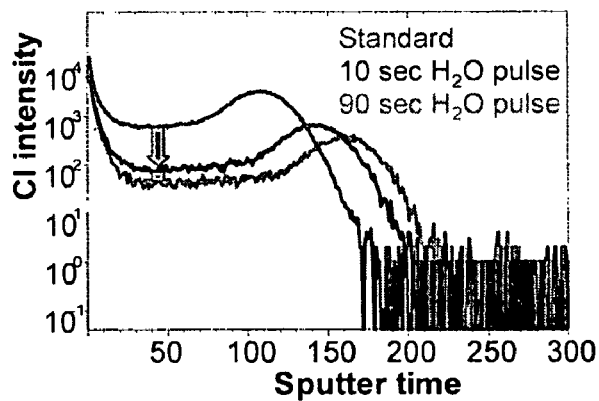
FIG. 2 illustrates the effect of the $H_2O$ pulse length on the TOFSIMS (Time-Of-Flight Secondary Ion Mass Spectroscopy) Cl-profile.

The steady growth-per-cycle for the Standard HfCl₄/H₂O ALD process at 300° C. (as described in Table 2) is 1.4 Hf/nm2 or 15% of a monolayer (FIG. 1), in agreement with literature. The growth-per-cycle is not fully saturated with the standard H₂O pulse of 0.3 seconds, as shown in FIG. 1. The growth-per-cycle saturates at a H₂O pulse of about 10 seconds to a value of 20% of a monolayer. Also the Cl-content is saturated at 10 seconds, as shown by TOFSIMS (FIG. 2). The growth-per-cycle does not depend on the HfCl₄ pulse length.

Figure 3:
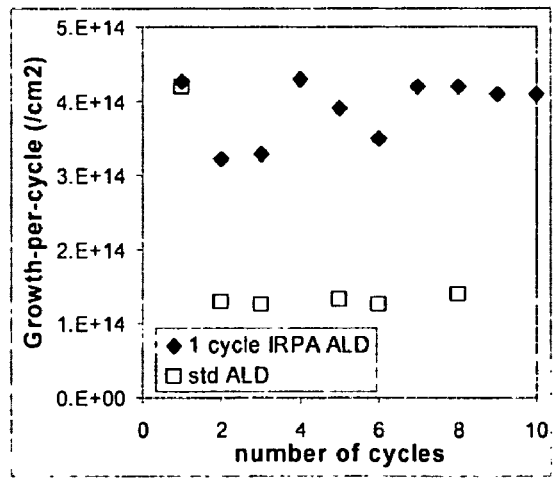
FIG. 3 illustrates the Growth-per-cycle (RBS) as a function of the number of cycles for $HfO_2$ on 1 nm chemical oxide substrates.

The effect of the 1 nm chemical oxide substrate on the growth-per-cycle for Standard HfCl₄/H₂O ALD compared to IRPA ALD is shown in FIG. 3. In the first reaction cycle, the growth-per-cycle is almost 3 times higher than the steady growth-per-cycle (4.3 Hf/nm2 or 47% of a monolayer) in agreement with literature. The substrate enhancement only acts in the first reaction cycle. This is surprising, as the chemical oxide substrate can by no means be fully covered by HfO₂ in the first cycle, as less than half a ML is deposited. Therefore, one would expect to see growth enhancement also in the second reaction cycle.

One possible explanation is that all Si—OH groups on the chemical oxide are consumed by reaction with HfCl₄ in the first reaction cycle. Any Si—O—Si bridges left uncovered by HfO₂ are not hydrolyzed in the H₂O pulse of the first reaction cycle. Therefore, HfO₂ in the second reaction cycle only reacts with the Hf—OH groups and the steady HfO2 growth-per-cycle is immediately reached. This would imply that, as the Si—O—Si sites are not reactive towards both HfCl₄ and H₂O precursors, no further growth is possible from the substrate; only sideward growth from HfO₂ islands is possible to cover that area.

Another possibility is that both Si—OH and Si—O—Si bridges react with HfCl₄. The reaction with the latter surface sites results in contamination of the Si substrate by Cl:

$$\text{Si—O—Si*} + \text{HfCl}_4 \rightarrow \text{Si—O—HfCl}_3\text{*} + \text{Si—Cl} \quad (3)$$

Si—Cl bonds are difficult to hydrolyze at 300° C. Therefore, in the next reaction cycles HfO₂ deposition on the Si—Cl sites is blocked. This would explain the larger Cl-content at the bottom interface of HfO₂ layers. The fact that the HfO₂ growth-per-cycle remains constant in the subsequent reaction cycles, and the decrease in Cl-content could indicate that nucleation on the HfO₂ substrate proceeds only on the Hf—OH groups, and that Hf—O—Hf bridges are less reactive than Si—O—Si bridges.

Plasma treatment every cycle enhances the steady growth-per-cycle from 15% of a monolayer to 42% of a monolayer (FIG. 3 and table 2).

A theoretical model for random deposition in ALD predicts that the higher the growth-per-cycle, the smaller the number of cycles required for film closure and the lower the roughness of the film. The growth mode of HfO₂ layers with different growth-per-cycle can be investigated by TOFSIMS surface measurements. The decay of the Si substrate intensity is plotted as a function of the Hf-coverage from RBS (FIG. 4).

Figure 4:
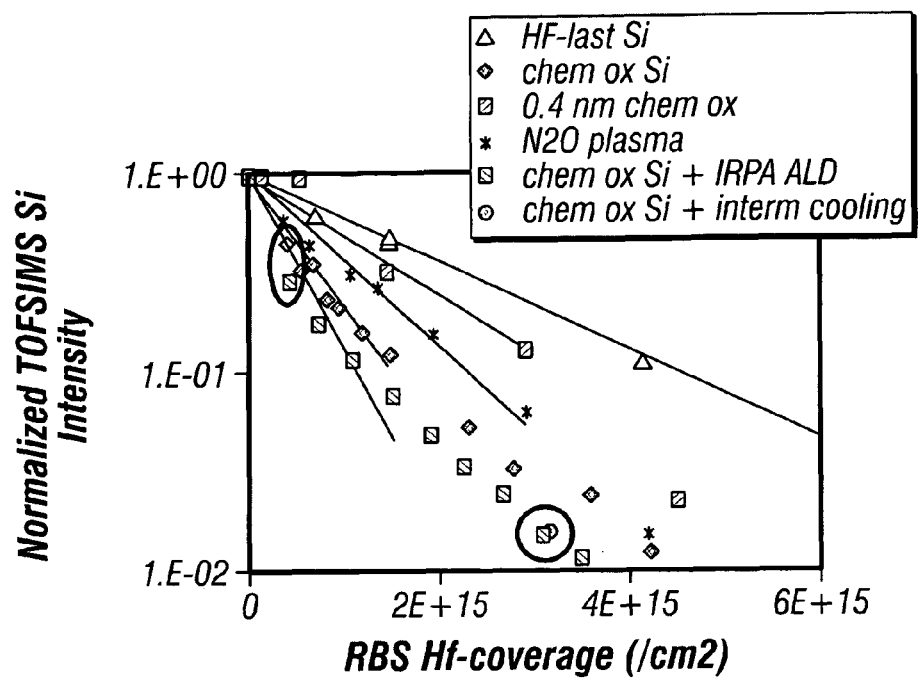
FIG. 4 illustrates the decay of the TOFSIMS Si intensity as a function of the RBS Hf-coverage for $HfO_2$ deposited with IRPA and standard ALD on chemical oxide substrates, and for standard $HfO_2$ on different starting substrates.
Figure 4:
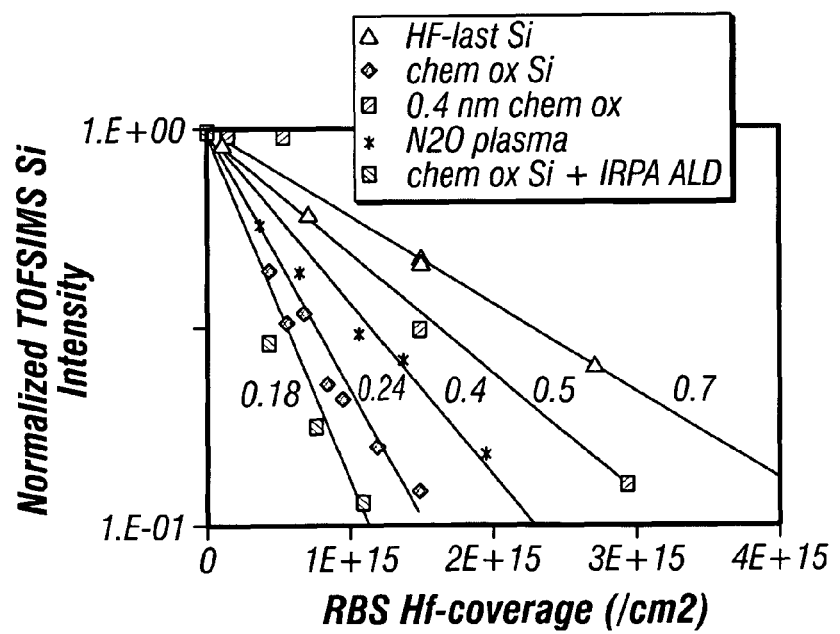

Indeed, a faster decay of the TOFSIMS Si intensity for IRPA ALD HfO₂ as compared to Standard ALD HfO₂ (FIG. 4). The difference with Standard HfO₂ ALD is small but systematic.

In table 2 the GPC (% ML) for different extended reaction cycles is shown. The Hf-coverage is measured by RBS or SE on samples with 10 reaction cycles. The growth-per-cycle is calculated as the average over the last 9 reaction cycles to exclude the enhancement effect of the substrate in the first reaction cycle.

TABLE 2

Growth-per-cycle for different reaction cycles.

| | Description of the reaction cycle | GPC RBS (Hf/nm²) | GPC RBS (% ML) | GPC SE (% ML) |
|---|---|---|---|---|
| 1 | Standard | 1.40-1.50 | 15-16% | 18-20% |
| 2 | Standard + RT plasma treatment | 4.10 | 42% | 49% |
| 3 | Standard + 5 min cooling | 3.21 | 34% | 40% |
| 4 | Standard + 90 sec cooling | 2.89 | 32% | 35% |
| 5 | Standard + 2 min 420° C. + 2 min cooling | 2.95 | 32% | 35% |
| 6 | HfCl₄ pulse + 4 min cooling | 0.85 | 9% | 12% |
| 7 | HfCl₄ pulse + 2 min 420° C. + 4 min cooling | 0.88 | 10% | 11% |

Growth enhancement is also observed for room temperature treatments without plasma (table 2 reaction cycle 3 and 4). The growth-per-cycle (34% of a monolayer) is slightly lower as compared to the RT (room temperature) remote plasma treatments (table 2 reaction cycle 2) (42% of a monolayer). Thus, an important contribution of the growth enhancement during plasma treatments comes from lowering the temperature. Therefore, one could suggest that the enhanced growth is caused by H₂O adsorption when the wafer is cooled down to room temperature:

$$\text{Hf—O—Hf*} + \text{H}_2\text{O} \rightarrow 2\text{Hf—OH*} \quad (4)$$

It has been shown that for moisture concentrations as low as 10-100 ppm are sufficient for monolayer coverage of H₂O on HfO₂ at room temperature. Thus, the moisture background in the transport module could suffice for the introduction of —OH groups during the transport from ALD to nitride reactor and back. The adsorption of H₂O in the transport module saturates within 90 seconds: similar growth enhancement is achieved for 90 seconds or 5 minutes intermediate cooling.

Support for the H₂O reaction in the transport module comes from the observation that HfO₂ can be deposited without H₂O pulse in the ALD reactor at 300° C., but with intermediate cooling in the transport module instead (Table 2 reaction cycle 6 and 7). Probably, the Cl-content of this HfO₂ layer is very high, as the Cl removal becomes more difficult at lower temperatures. The expected high Cl-content might explain why the growth-per-cycle for this process is slightly lower than for the standard ALD process.

The growth-per-cycle is also enhanced for intermediate anneal at 420° C. in the nitride reactor (table 2 reaction cycle 5), with the same amount as for intermediate cooling (table 2 reaction cycle 3 and 4). One would expect that the —OH density on the HfO₂ substrate decreases by thermal treatment, and as such, the growth-per-cycle is decreased. This probably indeed occurs during the intermediate anneal. However, the intermediate anneal is performed in the nitride reactor on the polygon platform, and the transport from nitride to ALD reactor takes about 2 minutes. As shown above, the $HfO_2$ surface can easily re-adsorb moisture during the cooling that occurs during this transport.

Figure 5:
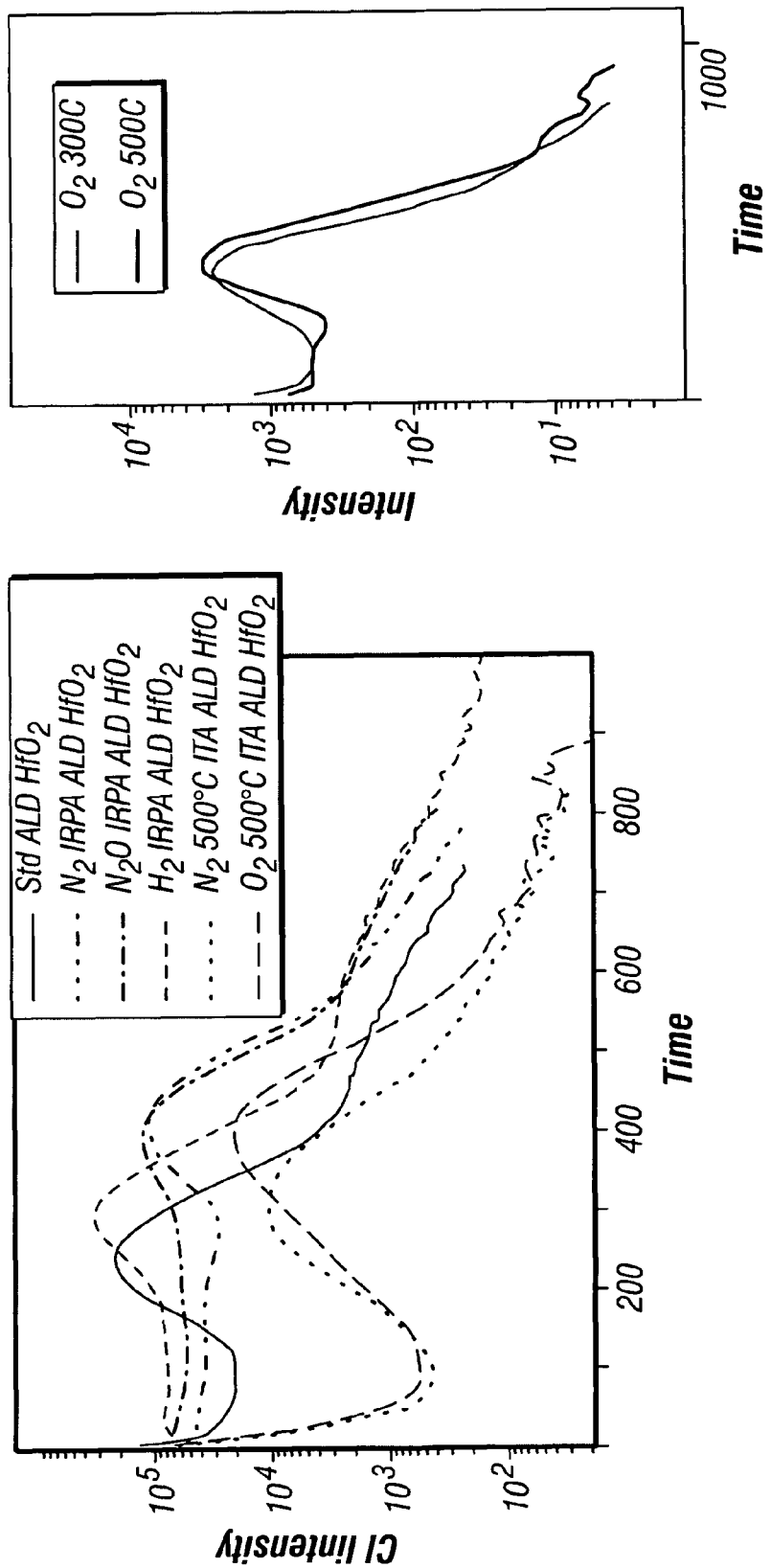
FIG. 5 illustrates TOFSIMS Cl-profiles of $HfO_2$ deposited with different extended reaction cycles and after different post deposition anneals.
Figure 6:
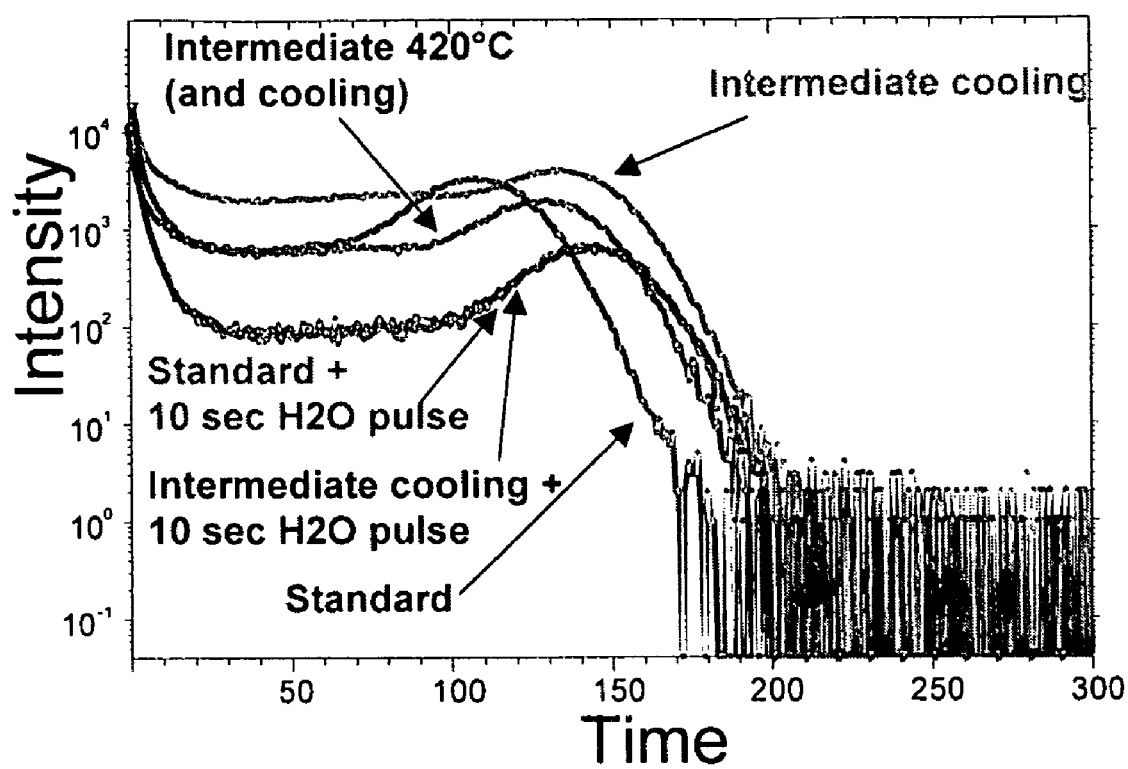
FIG. 6 illustrates TOFSIMS Cl-profiles of $HfO_2$ deposited with intermediate cooling and longer $H_2O$ pulses.

Analysis of the Cl content in $HfO_2$ layer can give more information on the ALD reaction mechanism because it shows the efficiency of Cl-removal by the $H_2O$ reaction and/or the intermediate treatments applied after the $H_2O$ reaction. TOFSIMS Cl-profiles of standard $HfO_2$ are therefore compared with $HfO_2$ deposited with the different extended reaction cycles (FIG. 5 and FIG. 6). The intermediate treatments are applied only every 10 reaction cycles instead of after every single reaction cycle in order to speed up the deposition of 4 nm $HfO_2$ layers (minimum thickness to obtain a reasonable Cl-profile). The effect of the intermediate treatment on the Cl content is still apparent in the Cl-profiles (FIG. 5 and FIG. 6).

One can see that $HfO_2$ deposited with plasma treatments or cooling in moisture contains about twice as much Cl as the Standard $HfO_2$ process (FIG. 5 and FIG. 6). Apparently, the standard $H_2O$ pulse of 0.3 seconds is too short to hydrolyze the much larger amount of Hf—Cl bonds, introduced by the enhanced growth-per-cycle. Therefore, the $H_2O$ pulse time is re-optimized for the enlarged growth-per-cycle. $H_2O$ pulses of 10 seconds are sufficient to reduce the Cl-content too a similar level as for the process without intermediate cooling (FIG. 6).

Cl can efficiently be removed by intermediate thermal treatments (FIG. 5(a)). The temperature and frequency of the intermediate anneal determines the efficiency of the Cl-elimination. A reduction of 2 orders of magnitude is obtained with intermediate anneals at 500° C. every 10 cycles. On the other hand, the Cl-content is not reduced during a post deposition anneal at 500° C. (FIG. 5(b)). For intermediate thermal anneals at 420° C. every 10 cycles, the Cl-content is reduced as compared to intermediate cooling, but the Cl-level is still at the same level as for the standard $HfO_2$ process. Applying a longer $H_2O$ pulse gives in this case a larger improvement. The ambient of the intermediate anneal ($O_2$ or $N_2$) does not influence the Cl-content of the layers. However, it can have a significant impact on the thickness of the interfacial layer. For $O_2$ anneals at 500° C., the interfacial oxide easily grows to more than 1 nm.

The following $HfCl_4/H_2O$ ALD reaction mechanism can be proposed.

Having regard to $HfCl_4$ reaction, in agreement with literature, it is proposed that $HfCl_4$ reacts with —OH groups and not with Hf—O—Hf bridges:

$$xOH^* + HfCl_4 \rightarrow O_xHfCl_{4-x}^* + xHCl \quad (5)$$

All experimental observations in this work support that in the standard process, the amount of Hf deposited in this half reaction is controlled by the number of —OH groups on the substrate, and not by steric hindrance of the —Cl ligands.

This is further investigated by using a recent model of growth-per-cycle (Table 3). The model is based on the mass balance of chemisorption and assumes a two-dimensional arrangement of the adsorbed ligands.

For the standard $HfO_2$ process, the growth-per-cycle is 1.4 Hf/nm2 for plasma treatments [Table 2]. During the $HfCl_4$ reaction, each Hf atom brings along four Cl ligands (using the $HfCl_4$ precursor). Thus, according to mass balance, about 5.6 (=4.1×4) Cl ligands/nm2 arrive to the surface. The maximum number of Cl ligands remaining on a flat surface when steric hindrance prevails can be estimated from the van der Waals radius of Cl (0.175 nm as 9.4/nm2). Thus, for the standard process, the amount of Cl after $HfCl_4$ reaction is still lower than the maximum allowed by steric hindrance. However, the maximum amount of Cl is most likely slightly lower than this theoretical value because this upper limit does not consider the specific bond arrangements in the Hf—Cl layer. Thus for the standard process, the model cannot give much information about the OH group content of the substrate.

On the other hand, the model can give some information in case of growth enhancement with intermediate treatments. The growth-per-cycle is 4.1 Hf/nm2 for plasma treatments [Table 2]. Thus, according to mass balance, about 16.4 (=4.1× 4) Cl ligands/nm2 arrive to the surface. This is much higher than the maximum number of Cl ligands allowed on a flat surface (9/nm2). Therefore, at least (16.6–9.4)≈7 Cl/nm2 have been removed by reaction with —OH (Table 3). Thus, this number also is a rough estimation of the —OH group density on $HfO_2$ after plasma treatment. For intermediate cooling, the —OH group density calculated in a similar way is 2-3/nm2 (Table 3).

TABLE 3

Amount of —OH groups on $HfO_2$ for different intermediate treatments after the $H_2O$ ALD half reaction obtained by using the steric hindrance model.

| Description of the extended reaction cycle | # OH (/nm²) |
|---|---|
| Standard + RT plasma treatment | 7 |
| Standard + 5 min cooling | 3 |
| Standard + 90 sec cooling | 2 |
| Standard + 2 min 420° C. + 2 min cooling | 2 |

Having regard to $H_2O$ reaction, the HfCl bonds introduced during the $HfCl_4$ pulse are hydrolyzed in the $H_2O$ reaction:

$$HfCl_x^* + xH_2O \rightarrow Hf(OH)_x^* + xHCl \quad (6)$$

At 300° C., this reaction is not complete as some residual Cl is present in the $HfO_2$ layer even if the $H_2O$ pulse is saturated.

As the temperature of the $H_2O$ reaction decreases, dissociation of $H_2O$ on oxygen bridges also becomes important:

$$Hf—O—Hf^* + H_2O \rightarrow 2Hf—OH^* \quad (7)$$

An effective way of eliminating Cl is by intermediate thermal annealing after the $H_2O$ pulse. The Cl-content is independent of the anneal ambient ($O_2$ or $N_2$). It is proposed that neighboring Hf—Cl and Hf—OH groups at the top surface react and release HCl:

$$HfCl^* + HfOH \rightarrow HfOHf^* + HCl \quad (8)$$

As such, oxygen bridges are created. It is proposed that this reaction becomes more important as the temperature of the anneal increases.

Thus, in order to enhance the growth-per-cycle from 15% to 40% of a monolayer and to reduce the Cl-content by 2 orders of magnitude, the following extended $HfCl_4/H_2O$ ALD reaction cycle can be proposed:

$HfCl_4$ reaction at 300° C.

$H_2O$ reaction at 300°

Annealing in $N_2$ for Cl-elimination at 500° C.

Hydroxylation with $N_2O$ plasma during and/or after moisture exposure at low temperature.

Figure 7:
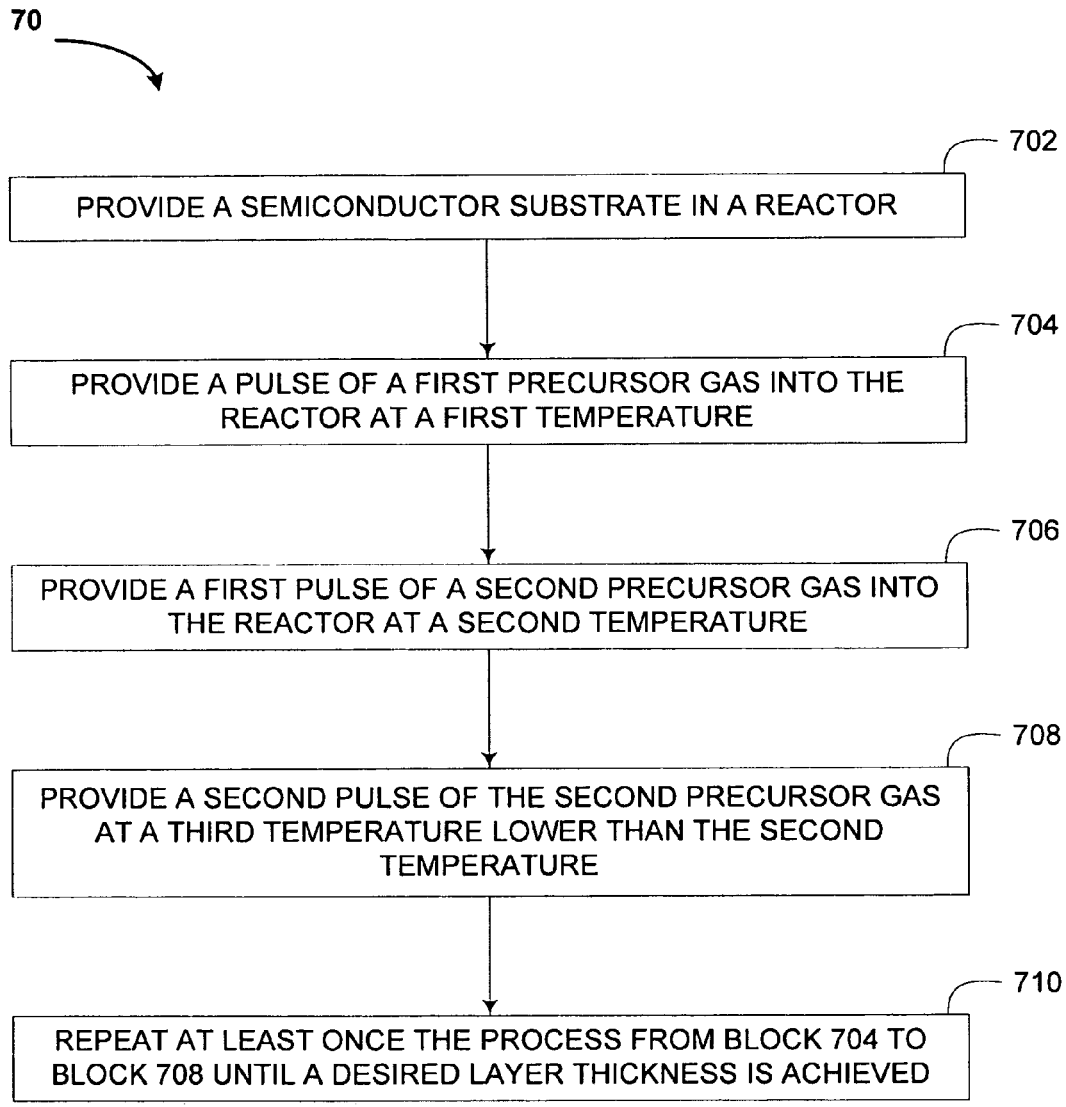
FIG. 7 is a flowchart illustrating one embodiment of an atomic layer deposition method.

FIG. 7 is a flowchart illustrating one embodiment of an atomic layer deposition method. Depending on the embodiment, certain steps of the method may be removed, merged together, or rearranged in order.

The method starts at a block 702, where a semiconductor substrate is provided in a reactor. Next at a block 704, a pulse of a first precursor gas is provided into the reactor at a first temperature. Moving to a block 706, a first pulse of a second precursor gas is provided into the reactor at a second temperature. Next at a block 708, a second pulse of the second precursor gas is provided at a third temperature lower than the second temperature. In some embodiments, the method may further comprise an optional block 710, wherein the process from block 704 to block 708 is repeated at least until a desired layer thickness is achieved.

Figure 8:
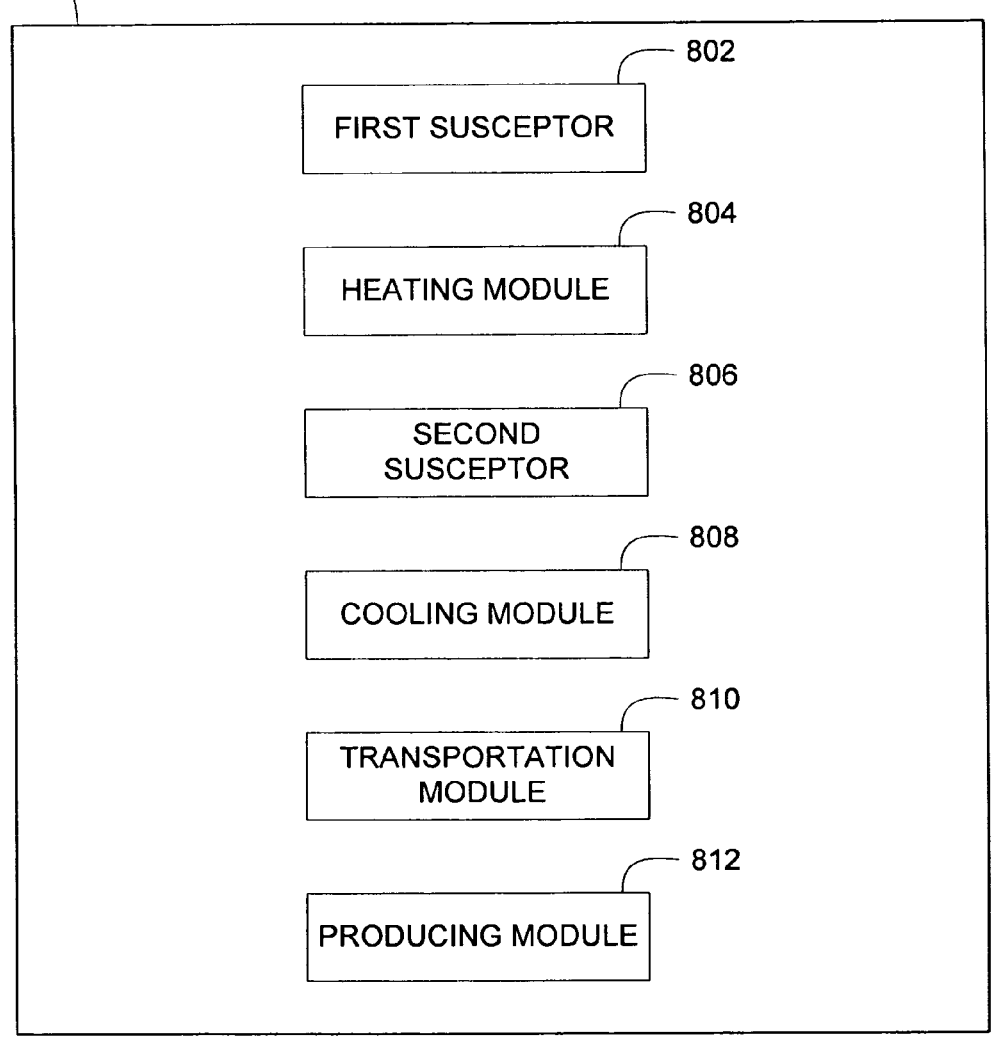
FIG. 8 is a functional block diagram illustrating one embodiment of a reactor suitable for performing the atomic layer deposition method.

FIG. 8 is a functional block diagram illustrating one embodiment of a reactor suitable for performing the atomic layer deposition method. The reactor 80 comprises a first susceptor 802 and a second susceptor 804. The susceptor may be any device, e.g., a plate, suitable for supporting (bearing) the substrate upon which the layer is to be deposited.

The reactor 80 further comprises a heating module 804 for heating a substrate when present on the first susceptor 802. The heating module 804 may comprise flash lamps or any device to created a temperature increase at at least the substrate surface.

The reactor 80 further comprises a cooing module 808 for cooling a substrate when present on the second susceptor 806. The cooling module 808 may comprise a recirculating cooling medium, such as cooled nitrogen, or a Peltier element or any device to create a temperature decrease at at least the substrate surface.

In some embodiments, the reactor 80 may further comprise a transportation module 810 for transporting a semiconductor substrate between the first and second susceptors. In some embodiments, the reactor may further comprise a producing module 812 for producing a plasma.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An atomic layer deposition method comprising:
   providing a semiconductor substrate in a reactor; and
   conducting one or more atomic layer deposition cycles to deposit one or more monolayers of the same material, the conducting of one or more atomic layer deposition cycles comprising:
      providing, in each cycle, a pulse of a first precursor gas into the reactor at a first temperature,
      providing, in each cycle, a first pulse of a second precursor gas into the reactor at a second temperature, and
      providing, at least once during the cycles, a second pulse of the second precursor gas at a third temperature lower than the second temperature, the second pulse of the second precursor gas not being used to form a plasma,
   wherein only the first precursor gas and the second precursor gas are provided as precursors during the conducting of the atomic layer deposition cycles, and wherein the first precursor gas is provided only at the first temperature, wherein the first precursor gas comprises hafnium tetrachloride and the second precursor gas comprises H2O.

2. The method according to claim 1, wherein the semiconductor substrate comprises a semiconductor material suitable in the field of integrated circuit (IC) processing.

3. The method according to claim 2, wherein the semiconductor substrate comprises at least one of the following: silicon, germanium, and silicon germanium.

4. The method according to claim 1, wherein the first temperature is substantially between about 100° C. and about 800° C.

5. The method according to claim 1, wherein the second temperature is substantially equal to or higher than the first temperature.

6. The method according to claim 1, wherein the conducting of one or more atomic layer deposition cycles further comprises:
   heating, at least once during the cycles, the substrate surface at a fourth temperature between the providing of a first pulse of a second precursor gas and the providing of a second pulse of the second precursor gas.

7. The method according to claim 6, wherein the fourth temperature is substantially equal or higher than the second temperature.

8. The method according to claim 6, wherein the heating of the substrate surface at a fourth temperature is performed in inert atmosphere.

9. The method according to claim 1, wherein the substrate is exposed to a plasma treatment after the providing of a second pulse of the second precursor gas.

10. The method according to claim 9, wherein the plasma comprises at least one of the following: N2O, NO, O2, N2, H2, NO2, and NH3.

11. The method according to claim 1, wherein the conducting of one or more atomic layer deposition cycles further comprises:
   exposing, at least once during the cycles, the substrate to an N2O plasma treatment after the providing of a second pulse of the second precursor gas.

12. An atomic layer deposition method for depositing an hafnium oxide (HfO2) layer, comprising:
   providing a semiconductor substrate in a reactor; and
   forming one or more monolayers of HfO2 by atomic layer deposition, the forming of one or more monolayers of Hf2 comprising:
      providing a pulse of HfCl4 in the reactor at about 300° C.,
      providing a first pulse of H2O in the reactor at about 300° C.,
      providing a second pulse of H2O in the reactor at room temperature, while the substrate is exposed to an N2O plasma treatment.

13. An atomic layer deposition method comprising:
   providing a semiconductor substrate in a reactor; and
   conducting at least a first and second atomic layer deposition cycle to deposit one or more monolayers of the same material, the second cycle being performed after the first cycle,
   wherein the first cycle comprises:
      providing a pulse of a first precursor gas into the reactor at a first temperature,
      providing a first pulse of a second precursor gas into the reactor at a second temperature, and
      providing a second pulse of the second precursor gas at a third temperature lower than the second temperature,
   wherein the second cycle comprises:
      providing a pulse of the first precursor gas into the reactor at the first temperature, and providing a first pulse of the second precursor gas into the reactor at the second temperature,
wherein the substrate is exposed to a plasma treatment during and/or after the providing of a second pulse of the second precursor gas, wherein the second precursor gas is H2O, and wherein the second pulse of the second precursor gas is provided while the substrate is exposed to an N2O plasma treatment.

14. An atomic layer deposition method comprising:
providing a semiconductor substrate in a reactor; and
conducting one or more atomic layer deposition cycles to deposit one or more monolayers of the same material, the conducting of one or more atomic layer deposition cycles comprising:
   providing, in each cycle, a pulse of a first precursor gas into the reactor at a first temperature,
   providing, in each cycle, a first pulse of a second precursor gas into the reactor at a second temperature, and
   providing, at least once during the cycles, a second pulse of the second precursor gas at a third temperature lower than the second temperature, the second pulse of the second precursor gas not being used to form a plasma,
wherein only the first precursor gas and the second precursor gas are provided as precursors during the conducting of the atomic layer deposition cycles, and wherein the first precursor gas is provided only at the first temperature,
wherein the first temperature and the second temperature are about 300° C., and the third temperature is room temperature.

15. The method according to claim 14, wherein the first precursor gas comprises a halide or an oxyhalide.

16. The method according to claim 15, wherein the halide comprises a metal halide and the oxyhalide comprises a metal oxyhalide.

17. The method according to claim 15, wherein the first precursor gas comprises at least one of the following: HfCl4, TaCl5, WF6, WOCl4, ZrCl4, AlCl3, POCl3, TiCl4, and SiCl4.

18. The method according to claim 14, wherein the second precursor gas comprises a precursor able to eliminate the ligands of the first precursor.

19. The method according to claim 18 wherein the second precursor gas consists of H2O, H2O2, O2, O3, NH3, H2S, H2Se, PH3, AsH3, C2H4 or Si2H6.

20. An atomic layer deposition method comprising:
providing a semiconductor substrate in a reactor; and
conducting one or more atomic layer deposition cycles to deposit one or more monolayers of the same material, the conducting of one or more atomic layer deposition cycles comprising:
   providing, in each cycle, a pulse of a first precursor gas into the reactor at a first temperature,
   providing, in each cycle, a first pulse of a second precursor gas into the reactor at a second temperature,
   providing, at least once during the cycles, a second pulse of the second precursor gas at a third temperature lower than the second temperature, the second pulse of the second precursor gas not being used to form a plasma, and
   heating, at least once during the cycles, the substrate surface at a fourth temperature between the providing of a first pulse of a second precursor gas and the providing of a second pulse of the second precursor gas,
wherein only the first precursor gas and the second precursor gas are provided as precursors during the conducting of the atomic layer deposition cycles, and wherein the first precursor gas is provided only at the first temperature,
wherein the fourth temperature is about 500° C.

* * * * *